United States Patent [19]
Acello et al.

[11] Patent Number: 5,830,781
[45] Date of Patent: Nov. 3, 1998

[54] SEMICONDUCTOR DEVICE SOLDERING PROCESS

[75] Inventors: Salvature J. Acello, St. James, N.Y.; Detlev D. Ansinn, Warrington; Robert J. Scott, Furlong, both of Pa.

[73] Assignee: General Instrument Corp., Hatboro, Pa.

[21] Appl. No.: 845,009

[22] Filed: Apr. 22, 1997

[51] Int. Cl.⁶ .......................... H01L 21/44; H01L 21/48; H01L 21/50
[52] U.S. Cl. .......................... 438/111; 438/112; 438/118; 438/123; 438/466
[58] Field of Search ..................... 438/111, 112, 438/118, 123, 366, 367, 369, 377, 380, 466; 29/827; 257/666, 672, 676, 686, 688, 727

[56] References Cited

U.S. PATENT DOCUMENTS

| | | | |
|---|---|---|---|
| 4,633,582 | 1/1987 | Ching et al. | 29/827 |
| 5,001,545 | 3/1991 | Kalfus et al. | 29/827 |
| 5,506,174 | 4/1996 | Vandenheuvel et al. | 438/111 |
| 5,637,917 | 6/1997 | Tomita et al. | 257/676 |

*Primary Examiner*—John Niebling
*Assistant Examiner*—David A. Zarneke

[57] ABSTRACT

A pair of metal lead frames are stacked together with a plurality of solder coated semiconductor chips sandwiched between respective pairs of overlapped portions of the lead frames and the lead frame stack is then disposed within a fixture comprising spaced apart clamping means for clamping together the overlapped portions of the lead frames. Only the clamping means contact the frame stack and in thermally and electrically insulated relation therewith for minimizing heat loss from and electrical shorting of the lead frame stack to the fixture. Electrodes are tightly clamped against exposed ends of the lead stack for passing electrical current through the stack for causing electrical resistance heating of the stack and the soldering of the chips to the lead frames.

7 Claims, 3 Drawing Sheets

SEMICONDUCTOR DEVICE SOLDERING PROCESS

BACKGROUND OF THE INVENTION

This invention relates to soldering, and particularly to a soldering process used in the batch manufacture of semiconductor devices.

Although not limited thereto, the present invention has particular utility in semiconductor device manufacturing processes of the type disclosed in U.S. Pat. No. 5,484,097 (Jan. 15, 1996) and U.S. Pat. No. 5,506,174 (Apr. 9, 1996), both issued to William Van denHeuvel. The subject matter of both patents is incorporated herein by reference.

In the patented processes, elongated sheets of metal, referred to as "lead frames," are patterned to include identical and spaced apart groups of device "components," e.g., device terminal leads and semiconductor chip mounting pads disposed at ends of the terminal leads. Each frame comprises a pair of spaced apart, parallel side rails and spaced apart cross bars extending between the rails along the length of the frame. Spaced along the cross bars and extending transversely therefrom, in directions parallel to the side rails, are cantilevered device terminals terminating in chip mounting pads. The lead frames are stacked one on top of the other with the chip mounting pads secured to the cross bars of one of the frames overlapping respective chip mounting pads secured to the cross bars of the other of the frames. The cross bars of the two frames can directly overlie one another or be in interdigitated relationship.

Semiconductor chips are sandwiched between overlapping pairs of chip mounting pads, and the entire assembly is heated for causing various layers of solder on the chips and frames to form solder joints. After cooling, the various groups of components, including semiconductor chips soldered therewithin, are encapsulated and then cut away from the lead frames.

Known soldering heating processes are generally satisfactory except that they are somewhat slow and difficult to control and modify. A preferred heating process, for example, comprises first heating the assembly to a first temperature for activating fluxes within the solder layers for providing clean surfaces, increasing the temperature for causing flow of the solder to form the solder joints, and cooling the assembly. Accurate control of the time versus temperature profile of the process is important both for obtaining high quality and high yield results and for minimizing the processing time for maximizing production output.

Heretofore, one heating process used comprises sandwiching the frame assemblies between electrically heated blocks and heating the assemblies by conduction from the heated blocks. While generally satisfactory, as mentioned, the thermal inertia of the system tends to be relatively high whereby short processing schedules involving rapid changes of temperature are somewhat difficult to obtain and control.

The present invention provides a superior arrangement for heating the lead frame assemblies in the soldering process.

SUMMARY OF THE INVENTION

In accordance with this invention, a pair (or more) of metal lead frames are stacked together with a plurality of semiconductor chips sandwiched between the frames for being simultaneously soldered within respective components of semiconductor devices. The lead frames are weakly secured together, e.g., by means of "pasty" layers of solder, and, in a preferred embodiment, the lead frame stack is sandwiched between a pair of clamping blocks each comprising a plurality of spaced apart columns disposed in a pattern corresponding to the pattern of overlapped chip mounting pads in the lead frame stack. Preferably, the stack and clamping blocks are in horizontal disposition. Each pair of overlapped chip mounting pads sandwiching a semiconductor chip therebetween is thus itself sandwiched between opposing surfaces at the ends of aligned columns extending respectively upwardly and downwardly from the clamping blocks. Each clamping column is preferably of, or terminated by, a material of low thermal and electrical conductivity for preventing flow of heat from or electrical shorting of the lead frame stack to the clamping blocks.

Oppositely disposed ends of the lead frame stack extend outwardly from the clamping blocks for being rigidly clamped between respective electrode clamps.

Current is then caused to flow between the two electrode clamps through the lead frame stack for electrical resistance heating of the frames for performing the soldering operation. During the soldering process, the clamping pressures provided by the oppositely disposed columns of the two clamping blocks and the electrode clamps maintain the mounting pads firmly pressed against surfaces of the chips for ensuring proper contacting of the molten solder to the surfaces being soldered together. Owing to the low thermal conductivity of the clamping portions of the clamping blocks, little heat is lost from the lead frame during the heating process which can thus be performed quite rapidly and with a high degree of control.

DESCRIPTION OF THE DRAWING

The figures are schematic and not to scale.

DESCRIPTION OF PREFERRED EMBODIMENTS OF THE INVENTION

By way of illustration, the present invention is described in connection with the soldering of a two lead frame assembly of the type described in the aforementioned U.S. Pat. No. 5,506,174. As disclosed in the patent, a plurality of semiconductor rectifier devices are simultaneously fabricated by means of an assembly comprising two metal lead frames including a plurality of spaced apart individual "sites" where a single semiconductor device is to be assembled and soldered together.

Figure 1:
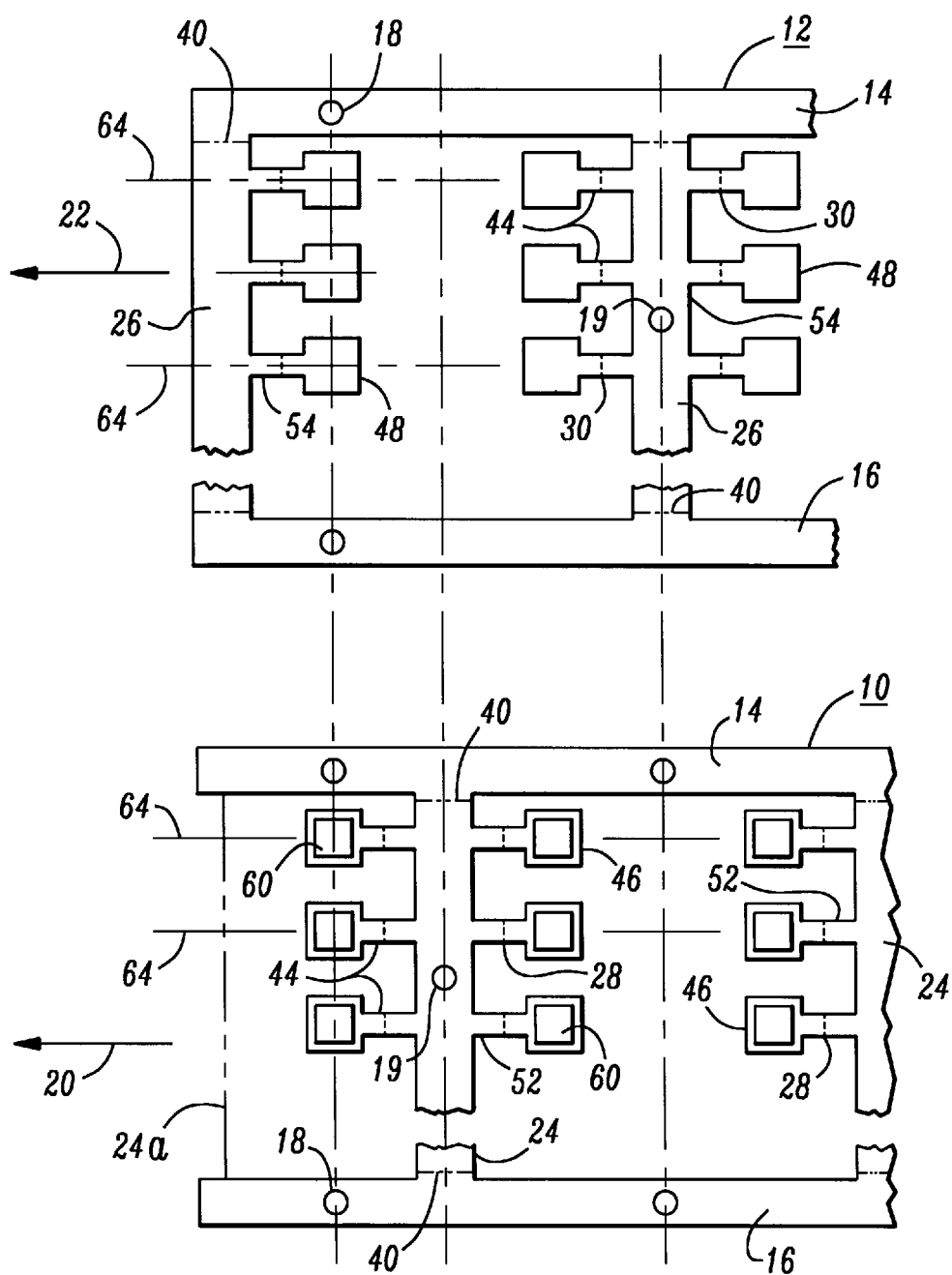
FIG. 1 is a plan view of two lead frames of a type processed in accordance with this invention.

FIG. 1 herein is a direct copy of FIG. 1 of U.S. Pat. No. 5,506,174 and shows two lead frames 10 and 12 in side-by-side, precisely laterally aligned relationship. Each of the lead frames comprises a pair of spaced apart side rails 14 and 16, with each rail including feeding and positioning openings 18 whereby the two lead frames can be mounted for precise in-step movements along parallel paths 20 and 22 past and through various work stations. Known apparatus for processing the two lead frames are not shown.

Extending between each pair of side rails 14 and 16 of each frame 10 and 12 are spaced apart cross bars 24 and 26, respectively. In FIG. 1 of U.S. Pat. No. 5,506,174, a left-hand end cross bar 24 of the lead frame 14 is not shown. Herein, such an end cross bar 24a is indicated by a dash line. The cross bars of the two lead frames (but not the end cross bars 24a of the lead frame 10) include a plurality of cantilevered terminals 28 and 30, respectively, extending therefrom. A semiconductor chip 60 is mounted on a mounting pad 46 disposed at an end of each of the extending terminals 28 on the lead frame 10. The chip 60 is held in place by means of a sticky, paste-like layer of solder (readily selected, depending upon the devices being made, from commercially available solder pastes) provided on one side of the chip. Once in place on the lead frame 10, a further layer of a solder paste is applied on the exposed side of the chip.

As mentioned, FIG. 1 shows the two lead frames 10 and 12 in left-to-right alignment, and the next step in the process is to form a stack of lead frames.

In the embodiment illustrated herein, only two lead frames are present to form a two lead frame thick stack 13. In other embodiments, a greater number of frames are used, e.g., three lead frames as disclosed in the afore-cited U.S. Pat. No. 5,484,097.

Figure 2:
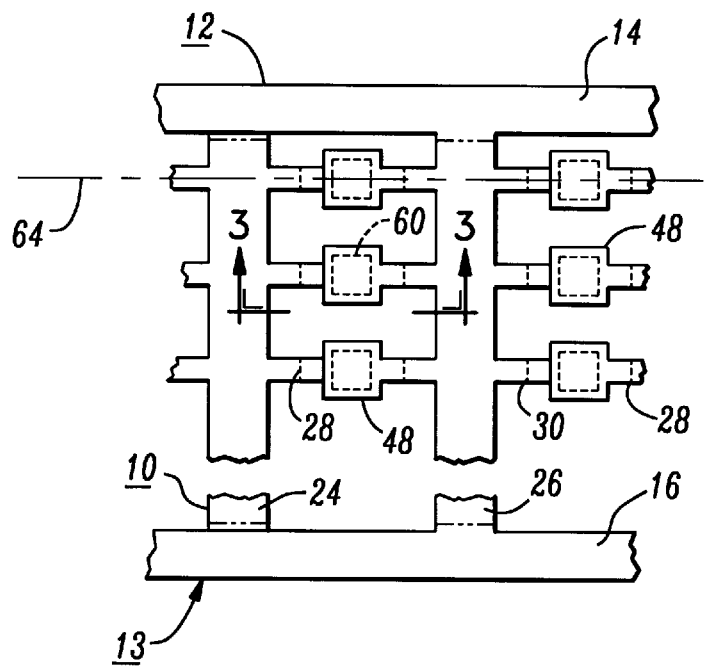
FIG. 2 is a plan view showing a portion of a lead frame assembly formed when the two lead frames shown in FIG. 1 are disposed one on top of the other.

FIG. 2 herein shows a lead frame stack 13 with the frame 12 shown at the top of FIG. 1 being disposed to overlie the frame 10. The left-to-right lateral alignment shown in FIG. 1 is preserved in the stack shown in FIG. 2, and the top-to-bottom alignment (i.e., in the plane of the page containing FIG. 2) is such that the two side rails 14 and 16 of the stack upper frame 12 precisely overlie the side rails 14 and 16, respectively, of the stack lower frame 10. With the two lead frames 10 and 12 so properly aligned within the stack, each mounting pad 48 of the lead frame 12 overlies a respective mounting pad 46 (FIG. 1) of the lead frame 10. As previously mentioned, the respective mounting pads 46 include semiconductor chips 60 mounted (pasted) thereon, and the undersides of the upper frame 12 mounting pads 46 press firmly against the solder paste layers on the upper surfaces of the chips 60. The respective semiconductor chips 60 are thus sandwiched between the two lead frames 10 and 12 and specifically, as shown in FIG. 3, between mounting pads 46 and 48 integral with the respective lead frames 10 and 12.

For completeness of description, it is noted that, in this embodiment, the cantilevered terminals 28 and 30 (FIG. 1) are each slightly off-set (bent) relative to the respective cross bars 24 and 26 from which the terminals 28 and 30 extend for providing clearance for the sandwiched chips while still allowing the various frame side bars 14 and 16 to firmly engage one another in the stack assembly. Also, while not illustrated, the end cross bars 24a of the lead frame 10 directly underlie and are in full surface to surface contact with respective cross bars 26 at the ends of the lead frame 12.

Figure 3:
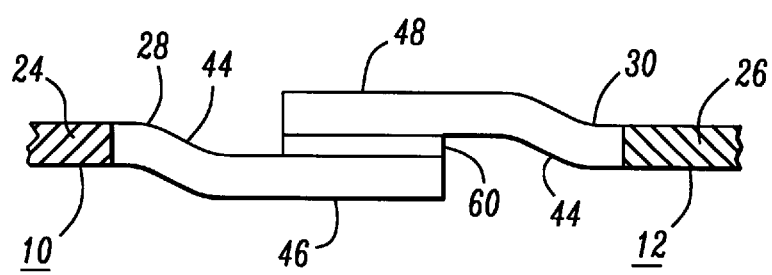
FIG. 3 is a cross-sectional view taken along line 3—3 of FIG. 2.

At the step illustrated in FIGS. 2 and 3, the two lead frames 10 and 12 are pasted together by means of the solder-paste loaded semiconductor chips 60 sandwiched between the two frames. According to the past practice, the pasted together lead frame stack is then loaded into a suitable heating fixture for the performance of a heating process for forming solder joints between the two opposite surfaces of the chips 60 and the surfaces of the mounting pads 46 and 48 contacting the chip respective surfaces. As previously mentioned, the heating fixture can comprise two electrically heated blocks between which is sandwiched the lead frame stack. The two blocks serve both to hold the lead frames of the stack firmly in place during the soldering process and to provide heat for the process.

In accordance with this invention, however, a somewhat different approach is followed wherein the heating and clamping functions are performed by separate but cooperating means.

Figure 4:
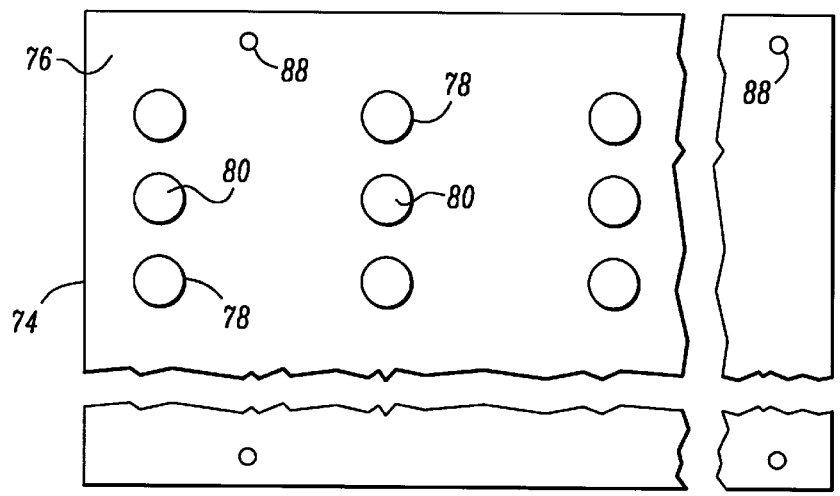
FIG. 4 is a plan view of a clamping block for receipt of a lead frame assembly comprising two stacked together lead frames.

In preparation of the soldering process, the lead frame stack 13 is disposed in a fixture 70 (FIGS. 4 and 5) comprising upper and lower blocks 72 and 74, e.g., of a refractory metal. The two blocks can be identical to one another, and one of the blocks, e.g., the lower block 74, is shown in FIG. 4. The block 74 comprises a bottom plate 76 and a plurality of short columns 78 projecting upwardly from the plate 76 and terminating in flat upper surfaces 80 lying in a common plane. For simplicity of construction, the columns 78 are integral extensions of the bottom plate 76 but are topped with a layer 82 of a material, e.g., mica, which is both heat resistant and of low thermal conductivity as well as an electrical insulator. The layers 82 can be of other materials used for liners of furnaces and the like.

Figure 5:
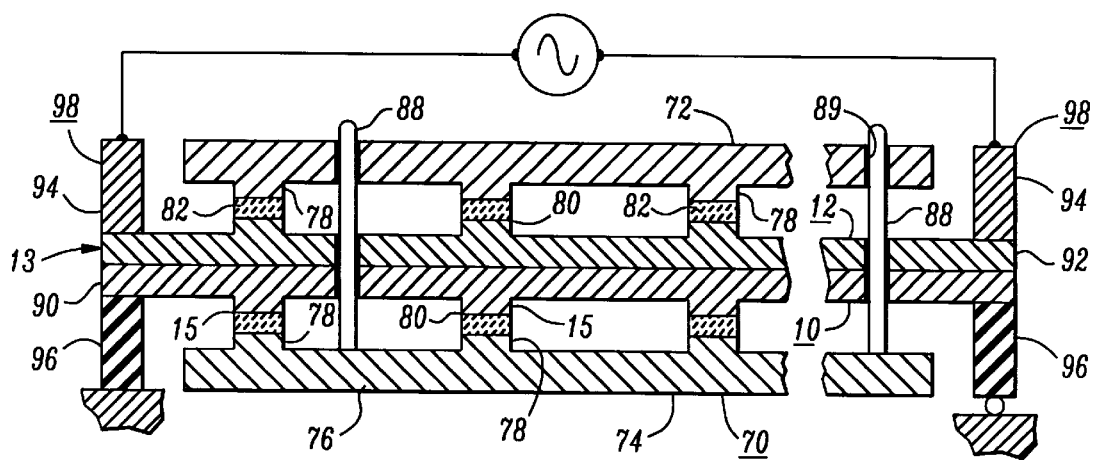
FIG. 5 is a cross-sectional view of an assembly, including two clamping blocks such as the one shown in FIG. 4, for electrical resistance heating of the lead frame assembly shown in FIG. 2.

The columns 78 are disposed in a pattern corresponding to the pattern (FIG. 2) of overlapped chip mounting pads 46, 48 of the lead frame stack 13, and, within the fixture 70, each pair of overlapped chip mounting pads is sandwiched between an upper surface 80 of an upwardly projecting column 78 of the lower block 74 and the "bottom" surface 80 of a downwardly projecting column 78 of the upper block 72. (In FIG. 5, the overlapped bonding pads, with a semiconductor chip disposed therebetween, are shown simply as a slight enlargement 15 of the lead frame stack 13; the actual overlapped pads appearing as shown in FIG. 2.) The only portions of the lead frame stack 13 contacting the fixture 70 are the pairs of overlapped chip mounting pads 15 sandwiched between oppositely disposed and aligned fixture columns 78. Also, as indicated in FIG. 5, the two blocks 72 and 74 of the fixture 70 are spaced apart by the intervening clamped portions of the lead fixture stack 13. Accordingly, the full weight of the upper block 72 is applied through the downwardly extending columns 78 thereof for applying clamping pressure against the overlapped pairs of chip mounting pads. The clamping pressure is not large and serves merely to ensure full surface to surface contacting of the chip mounting pads and the chips disposed therebetween.

Conveniently, for proper alignment of the lead frame stack 13 relative to the fixture columns 78, the bottom block 74 is provided with vertical alignment pins 88 which are threaded through positioning holes 19 (FIG. 1) through the cross bars 24 and 26 of the lead frames. With the lead frame stack 13 threaded onto the alignment pins 88 and disposed in place on the lower block 74, the upper block 72 is likewise threaded onto the alignment pins 88, via openings 89 through the upper block 72, for proper alignment of the upper block 72 on the lead frame stack 13.

As shown in FIG. 5, opposite ends 90 and 92 of the lead frame stack 13 (each end comprising a pair of overlapped end cross bars 24a and 26—as indicated in FIG. 1) project outwardly from the fixture 70. Each of these ends 90 and 92 is then rigidly clamped between jaws 94 and 96 of a respective electrode clamp 98. Each electrode clamp 98 provides a means for passing heating current through the lead frames and, in addition, serves to rigidly clamp together the two frames 10 and 12 of the lead frame stack 13 (the fixture columns 78 only contacting spaced apart and cantilevered portions of the lead frames and, as previously noted, not providing large clamping pressures) while minimizing loss of heat from the stack 13 to the electrode clamps 98. To this end, while the clamp jaw 94 is of metal, for low resistance electrical contacting to the lead frame stack, the other clamp jaw 96 is of an electrical and thermal insulating material, e.g., a known ceramic. As indicated schematically in FIG. 5, the two electrode clamps 98 are movable relative to one another for accommodating lengthwise thermal expansion of the lead frame stack during the soldering process.

A voltage is then applied between the two electrode jaws 94, 96 for passing an electrical current along the lead frame stack 13 for causing electrical resistance heating of the stack. Typically, the lead frames 10 and 12, e.g., of copper, are of low electrical resistance, and but a small voltage, e.g., 1–2 volts, need be applied for passing a large current (e.g., 700–800 amps) through the stack 13. Low voltage, high current power supplies suitable for use herein are commercially available for use in soldering irons, space heaters, and the like. The large current causes heating of the lead frames and attendant heating of the various solder layers in place thereon for performing the desired soldering process. Owing to the clamping pressures provided by the clamping fixture 70 and the clamp electrodes 98 exceptionally uniform and sound solder joints are obtained. Thermal expansion of the lead frame stack occurs, particularly along the lengths of the lead frames, but by avoiding excessive clamping pressures by the clamping pairs of columns, lateral expansions of the lead frames of the stack are accommodated by lateral sliding of the various clamped pairs of mounting pads between the fixture columns 78. The side rails 14 and 16 of the lead frames are not contacted by the clamping blocks 72 and 74, hence the clamping blocks do not interfere with the lengthwise expansion of the frames. Additionally, as described, the relatively movable clamping electrodes 98 likewise accommodate such expansion.

As mentioned, only relatively small voltages need be used in the process, thereby avoiding electrical stressing of the semiconductor chips. Actually, even relatively large voltages could be applied because no potential differences are created in the thickness direction of the lead frame stack, i.e., between terminals of the semiconductor chips, hence no electrical voltages are applied across the chips during the soldering process.

The amount of heating is readily controlled by the electrical current which is itself readily controllable by known means. The thermal gradients along the lead frame stack 13 are relatively small owing to the high thermal conductivity of the metal lead frame stack, and, owing to the thermal insulating clamping means used, the avoidance of paths for heat removal from the lead frame.

Additionally, owing to the open construction of the soldering fixture 70, cooling gases can be flowed through the fixture for rapid and uniform cooling of the lead frame stack 13. Accordingly, taking together the possible rapid heating and rapid cooling of the lead frame stack, highly precise and rapidly performed soldering processes are achievable.

What is claimed is:

1. A method of fabricating semiconductor devices comprising the steps of stacking together a pair of metal lead frames in preselected registration and with a plurality of semiconductor chips each sandwiched between a respective pair of overlapped portions of the lead frames, applying mechanical pressures across said pairs of overlapped portions for clamping said overlapped portions against said chip sandwiched therebetween, grasping spaced apart parts of said stacked lead frames, other than said chip clamping portions, by electrodes, and passing an electrical current between said electrodes through said lead frames for electrically resistive heating said frames for soldering said chips to said frames.

2. A method according to claim 1 including threading an elongated guide pin through aligned openings through respective ones of said frames for maintaining the preselected registration of said frames during said pressure applying step.

3. A method according to claim 1 including, after said heating step, cooling said frames by flowing a cooling gas along surfaces of said lead frames adjoining said overlapped portions.

4. A method according to claim 1 wherein said pressure applying step comprises contacting one of the portions of each of said pairs of overlapped lead frame portions with an end surface of a respective one of a plurality of spaced apart first clamping elements disposed on a first section of a fixture, and contacting the other of the portions of each of said pairs of overlapped portions with an end surface of a respective one of a plurality of spaced apart second clamping elements disposed on a second section of said fixture maintained in fixed, oppositely disposed relation to said fixture first section.

5. A method according to claim 4 wherein said stacked pair of lead frames contacts said fixture only at said end surfaces of said clamping elements and in a thermal and electrical insulated relationship with said elements.

6. A method according to claim 5 wherein said grasping step comprises clamping each of said lead frame parts between a respective one of first and second pairs of jaws, a first of the jaws of each jaw pair being of metal for electrical connection to one of said lead frames, and a second of the jaws of each jaw pair being of a thermal insulating material.

7. A method according to claim 6 wherein said first and second pairs of jaws are movable relative to one another in a direction of current flow through the lead frames for accommodating thermal expansion of said lead frames during said resistive heating thereof.

* * * * *